United States Patent [19]

Barnert

[11] 4,407,230
[45] Oct. 4, 1983

[54] GAS-FEED NOZZLE FOR A PYROLYTIC PARTICLE COATING APPARATUS

[75] Inventor: Eike Barnert, Jülich, Fed. Rep. of Germany

[73] Assignee: Kernforschungsanlage Jülich GmbH, Jülich, Fed. Rep. of Germany

[21] Appl. No.: 385,097

[22] Filed: Jun. 4, 1982

Related U.S. Application Data

[63] Continuation of Ser. No. 186,700, Sep. 12, 1980, abandoned.

[30] Foreign Application Priority Data

Sep. 18, 1979 [DE] Fed. Rep. of Germany ....... 2937652

[51] Int. Cl.³ .......................... B05B 1/34; C23C 11/00
[52] U.S. Cl. .................................... 118/716; 118/303; 118/DIG. 5; 427/6; 427/213
[58] Field of Search ................. 118/DIG. 5, 716, 303, 118/62; 427/6, 185, 213; 422/140, 143; 239/432

[56] References Cited

U.S. PATENT DOCUMENTS

| | | | |
|---|---|---|---|
| 1,503,817 | 8/1924 | Compere | 239/432 X |
| 2,218,880 | 10/1940 | Hanson | 118/303 X |
| 3,443,621 | 5/1969 | Dubrevil | 118/303 X |
| 4,153,004 | 5/1979 | Barnert | 118/716 |
| 4,259,925 | 4/1981 | Barnert et al. | 118/716 |

Primary Examiner—John D. Smith
Assistant Examiner—Bernard F. Plantz
Attorney, Agent, or Firm—Frishauf, Holtz, Goodman & Woodward

[57] ABSTRACT

For certain related dimensions of features of a nozzle feeding a fluidized bed reactor from below, it has been found that a central flow of a coating gas is squeezed down in diameter in passing through a constriction at the nozzle end by the action of the surrounding dilution gas flow, without the setting up of turbulence such as might have been expected, which would cause deposits from the decomposition of the coating gas at the constriction. The spacing between the mouth of the central tube that feeds the coating gas and the constriction at the end of the nozzle should be in the range of 20 to 70 mm, the diameter of the constriction aperture should be in the range from 3 to 10 mm and the diameter of the central channel should be greater than the constriction aperture diameter but not more than 3.5 times the latter diameter. For coating particles having a density of about 10 g/m³ and a diameter of about 200 μm, the constriction aperture diameter should not exceed 7 mm.

2 Claims, 3 Drawing Figures

GAS-FEED NOZZLE FOR A PYROLYTIC PARTICLE COATING APPARATUS

This is a continuation of application Ser. No. 186,700 filed Sept. 12, 1980, now abandoned.

This invention concerns a gas nozzle for supplying a decomposable gas and also a dilution gas to an apparatus for the coating of fuel kernels for a nuclear reactor, and more particularly a nozzle provided by the introduction of improvements in the kind of nozzle disclosed in my earlier U.S. Pat. No. 4,153,004, issued May 8, 1979.

In that prior patent, a nozzle was disclosed in which the coating gas is supplied through an inner tube which terminates short of the end of an outer containing tube which forms an annular channel around the inner tube for the supply of the dilution gas, so that a chamber is formed between the ends of these channels and the connection of the outer tube to the bottom of the heated reaction container thereabove, a constriction being provided where the outer tube joins the reaction container, with its aperture aligned with the common axis of the two gas supply tubes. A porous barrier in the annular channel assures a uniform velocity profile of the dilution gas.

In the description of that structure, it was stated that the aperture of the constriction should preferably have an area of which ranges from 1 to 2.5 times the cross-sectional area of the central channel and that the diameter of the outer tube should preferably have a diameter 5 to 10 times the diameter of the central channel and that, furthermore, the spacing between the end of the inner tube and the place of smallest cross-sectional area of the constriction should preferably be 5 to 40 times the diameter of the central channel.

Nozzles of the type described are provided for fluidized bed reactors, and arranged in a manner so as to fluidize the bed from below. fuel having a diameter of a few hundred μm by pyrolysis with suitable materials, in order to inhibit the giving off of fission products resulting from nuclear fission. For the pyrolysis, suitable gasses are methane, propane, propylene, chlormethylsilane, molybdenum pentachloride or the like. They are introduced into the fluidized bed with a suitable dilution gas such as argon, helium, hydrogen, nitrogen, carbon monoxide, or the like. The reactor temperature lies between 1000° and 2200° C.

The above mentioned spacing between the end of the wall of the central channel and the narrowest part of the constriction of the outer containing wall above which the fluidized bed is formed in the overlying reactor results in the walls of the central channel never reaching the temperature at which the coating gas decomposes. Since that central tube is furthermore also cooled, the formation of precipitates of the coating material at the part of the nozzle forming the mouth of the central channel is prevented. The coating gas stream, moreover, directed by the central channel to the middle of the constriction of the outer containing wall is sheathed laterally by the carrier gas stream issuing from the annular channel so long as the flow of the gasses is laminar, and thus is kept away by the dilution gas stream from the guiding surfaces of the outer containing wall, all the way to the constriction. The formation of precipitates in the remaining parts of the nozzle is thus prevented. This applies particularly for the portions of the nozzle forming the constriction, which portions are at a temperature sufficiently high for the decomposition of the coating gas.

In practice it is sought to coat as large a quantity of particles as possible in one operation in the fluidized bed reactor. That requires, in addition to an enlargement of the fluidized bed, in order to increase its capability of taking up the larger quantity of coating gas, an increase of the amount of coating gas to be introduced into the fluidized bed per unit of time. That postulates a corresponding enlargement of the nozzle. The problem then arises, however, that both the diameter of the central channel and the diameter of the constriction cannot be increased as much as might please a production engineer, because the greater diameter of the central channel causes the central stream of the coating gas to become "soft" with consequent stream-flow instabilities similar to those which might be observed in a flickering candle flame. To great a diameter of the constriction, on the other hand, leads to a bulk motion of the fluidized bed, whereby it appears to rock horizontally back and forth. Such motion is to be avoided as it inhibits proper particle coating and causes particle loss by accelerating individual particles downward through the constriction. These particles are then to be regarded as waste.

SUMMARY OF THE INVENTION

It is an object of the invention to dimension a nozzle of the above described kind so that the largest possible quantity of particles can be coated in a single operation, without sacrifice by the nozzle of its advantageous properties with respect to inhibition of accumulation of deposits on parts of the nozzle.

It has been discovered that certain dimensional limits will assure attainment of these objectives. Briefly, according to the invention the diameter of the opening of the constriction is in the range from 3 to 10 mm, the diameter of the central channel is greater than the diameter of the constriction, but the ratio of the magnitudes of the two diameters must not exceed the factor 3.5 and, furthermore, the spacing between the mouth of the channel bringing the separate gasses and the constriction is in the range from 20 to 70 mm.

Since in the case of the nozzle according to the invention the diameter of the constriction is smaller than the diameter of the central channel, the laminar central stream is constricted in the plane of the constriction in such a way that its diameter on passage through the constriction is smaller than the constriction diameter. This squeezing or binding depends particularly on the supply of the dilution gas forming the annular flow. The greater the throughput of the annular flow is made, the greater is the squeezing together of the central stream.

It has been unexpectedly found that the squeezing together of the central stream in no way leads to reduction of its gas flow though the constriction. On the contrary, upon the adjustment of the maximum possible throughput with reference to the requirement of laminar flow (Re≦2300) the diameter of the constriction within the limits given above becomes practically of no concern. This change takes place with and without squeezing together for equal Reynolds number of the central stream $$Re_Z = \frac{u_Z \cdot d_Z \cdot \rho_Z}{\eta_Z} \text{ in which}$$

$u_z$: velocity of the fluid forming the central stream upon exit from the central channel $d_z$: diameter of the central stream upon leaving the central channel $\rho_z$: density of the fluid forming the central stream $\eta_z$: dynamic viscosity of the fluid forming the central stream The invention thus teaches by what measures and within what limits the throughput of the gas can be increased, for a given constriction diameter, without changing the gas flow of the central stream from laminarity to turbulence.

The nozzle according to the invention can be installed for the coating of particles having a density in the region from about 4 to about 10 grams per cubic centimeter, with a diameter in the range from about 200 to about 500 μm. It is particularly effective, in the case in which the particles to be coated have a density of about 10 g/cm³ and a diameter of about 200 μm, for the diameter of the constriction to be no greater than 7 mm.

BRIEF DESCRIPTION OF THE DRAWINGS

The invention is further described below by way of illustrative example together with results of experiments, or with reference to the annexed drawings, in which.

The above-mentioned graphs show the necessary throughput of the annular stream of dilution gas for a given throughput of the central stream of decomposable gas in order to provide such a squeezing together of the central stream that no contact of the reaction gas with the parts forming the constriction results. Air was used as the fluid in both the central channel and in the annular channel for the tests.

DESCRIPTION OF AN EMBODIMENT AND OF TESTS

Figure 1:
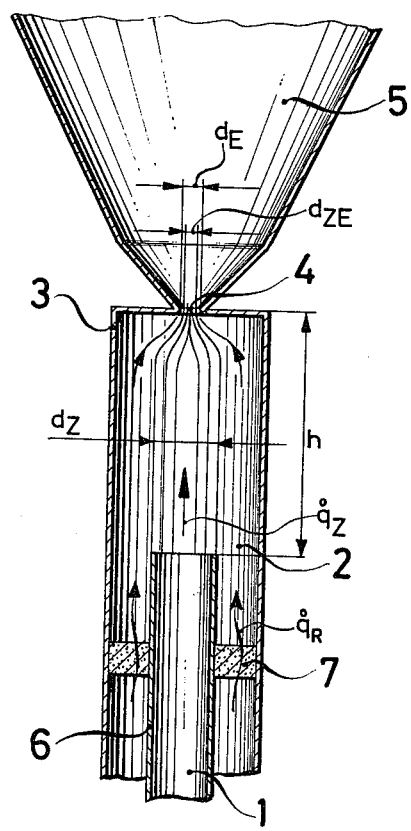
FIG. 1 is a diagramatic cross-section of a nozzle according to the invention.

The nozzle shown in FIG. 1 has a central channel 1 and an annular channel 2 surrounding the central channel. Although not so shown in the drawing, the central channel may be formed of a bundle of tubes instead of a single tube in order to obtain the advantages set forth in application Ser. No. 85,780, filed Oct. 17, 1979 now U.S. Pat. No. 4,259,925. The wall 3 containing the annular channel 2 is prolonged so that it ends at the constriction 4 having the aperture diameter $d_E$. The constriction also forms the lower boundary of the fluidized bed 5 that is only partly shown in the drawing. The mouth of the inner tube 6 forming the central channel 1 lies at a spacing h from the constriction 4 and is therefore not at a temperature high enough for the decomposition of the coating gas during operation of the device.

The coating gas stream leaving the central channel 1 and the dilution gas stream leaving the annular channel 2 proceed, so long as the flow is laminar, as if in separate flow paths to the narrowest place 4 of the containing wall, so that the material forming the constriction is in contact with and flushed by only the inert dilution gas. At the same time the central stream after leaving the central tube at first has the diameter $d_Z$, but is squeezed down to the diameter $d_{ZE}$ as it reaches the constriction. For producing an uniform velocity profile of the dilution gas made of porous graphite or sintered metal, forming a porous layer, is provided in the annular channel. The annular plate 7 also serves to hold the inner tube 6 which is movable in the axial direction.

Figure 2:
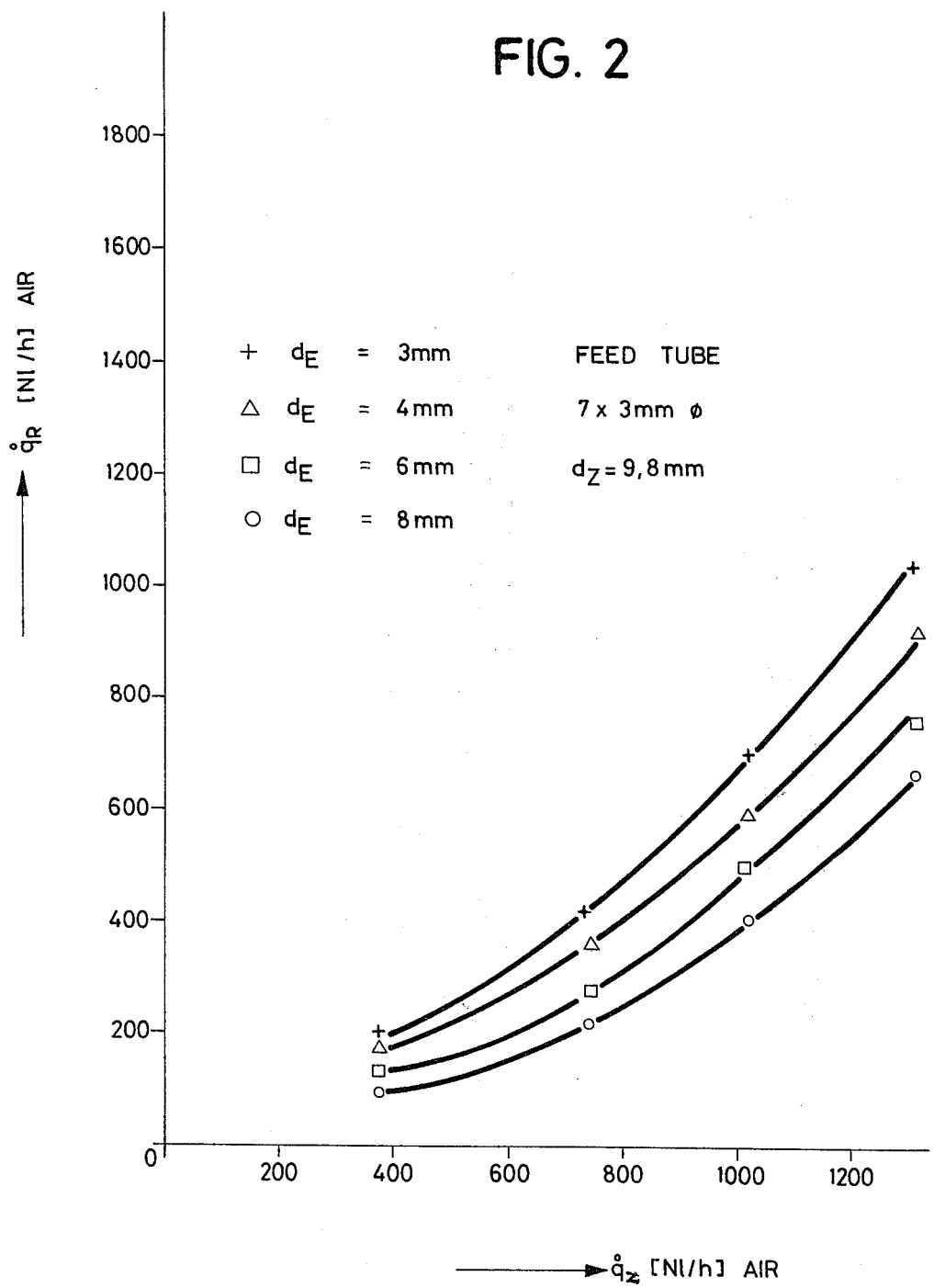
FIG. 2 is a graph of the results of a series of tests of a nozzle having a central channel formed of a bundle of 7 tubes.
Figure 3:
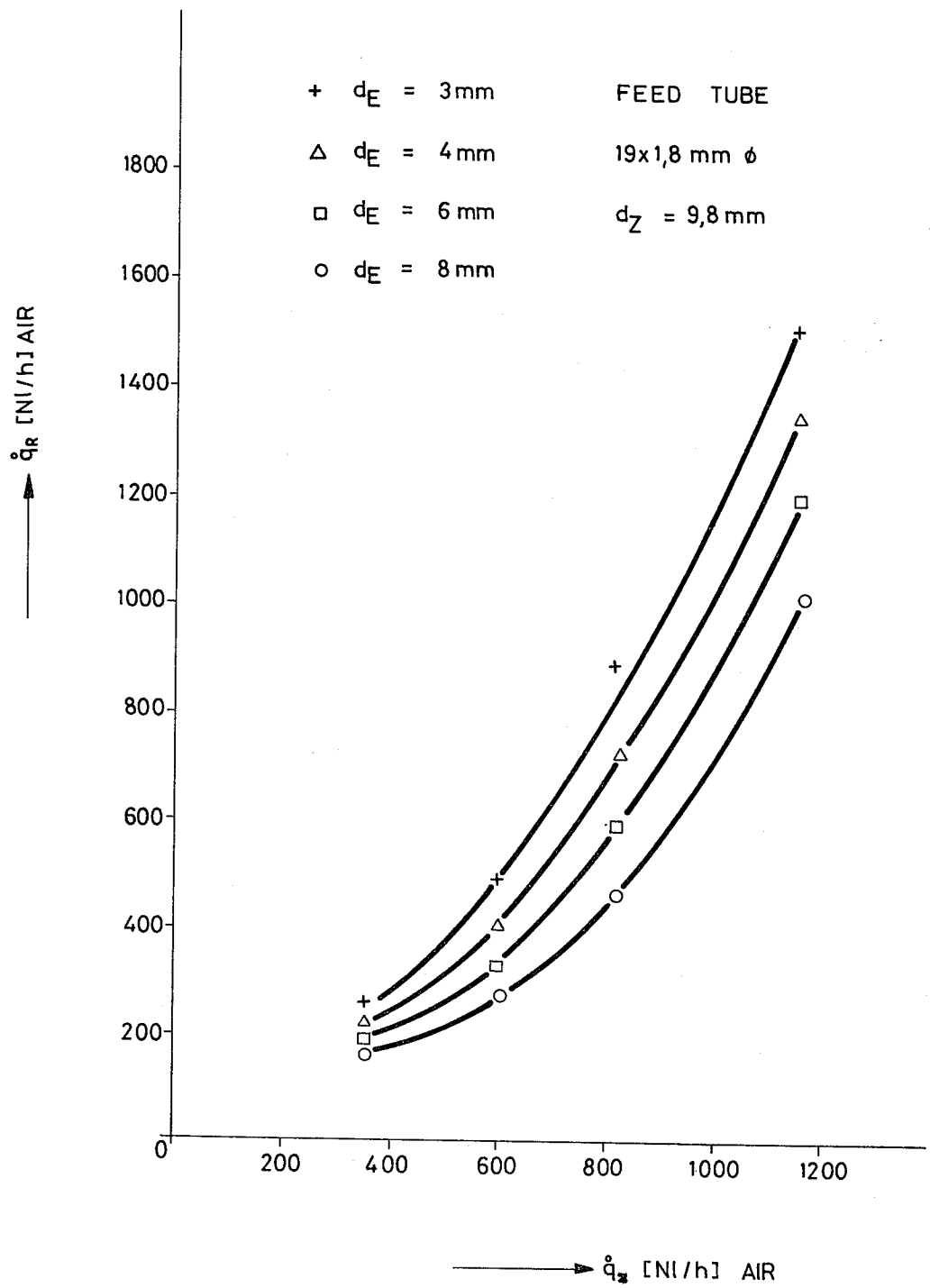
FIG. 3 is a graph of the results of a series of tests on a nozzle utilizing a bundle of 19 tubes for the central channel.

The graphs given in FIGS. 2 and 3 show for two nozzles differing in the constitution of the central channel (different bundles of individual tubes) what the minimum annular channel throughput $q_R$ is for a given central channel throughput $q_Z$, to which minimum value the dilution gas flow can conveniently be adjusted in practice. The diameter $d_Z$ of the central channel in both cases was 9.8 mm. In the case of the tube bundle consisting of 7 tubes the diameter of the individual tubes was 3 mm, whereas in the case of the bundle consisting of 19 tubes, the diameter of an individual tube was 1.8 mm. The different diameters $d_E$ of the constrictions that were used in the tests were 3, 4, 6 and 8 mm, the spacing h of the mouth of the central channel from the constriction was 50 mm and the annular stream diameter was 26 mm. A simple calculation shows that the ratios $d_Z$ to $d_E$ for the four tests were respectively 1.225, 1.633, 2.450 and 3.267.

250 ml of resin particles having a diameter in the range of between 200 and 300 μm and a density equal to 1.5 g/cm³ were provided as a load for the fluidized bed. From the data provided for the air throughputs $q_R$ and $q_Z$ in FIGS. 2 and 3, it is evidently possible, by means of Reynolds numbers, to calculate the throughput for corresponding conditions for the case of any particular gases.

Although the invention has been described with reference to a particular illustrated embodiment and particular tests, it will be evident that variations and modifications are possible within the inventive concept.

I claim:

1. A gas feed nozzle apparatus for supplying a decomposable coating-producing gas and a dilution gas to an apparatus for the coating of fuel kernels for use in a nuclear reactor, having a central channel for supplying said coating-producing gas and a surrounding channel of annular cross-section for said dilution gas defined by the wall of said central channel and an outer containing wall which is prolonged beyond the mouth of said central channel, said outer containing wall terminating in a constriction leading into an upwardly flaring entrance of a reaction vessel and comprising the improvement which consists in that:

the diameter ($d_E$) of the opening of said constriction (4) is in the range from 3 to 10 mm;

the diameter ($d_z$) of said central channel (1) is at least 1.225 times said diameter ($d_E$) of said constriction opening but does not exceed 3.5 times said constriction opening diameter, and the spacing between the end of the inner channel wall forming the mouth thereof and said constriction is in the range of 20 to 70 mm.

2. A gas feed nozzle apparatus as defined in claim 1 for supplying gas to an apparatus for the coating of particles having a density of about 10 g/cm³ and a diameter of about 200 μm, in which said diameter ($d_E$) of the opening of said constriction (4) does not exceed 7 mm.

* * * * *